United States Patent
Jiang et al.

[11] Patent Number: 5,857,050
[45] Date of Patent: Jan. 5, 1999

[54] PACKAGING FOR OPTOELECTRONIC DEVICE

[75] Inventors: Ching-Long Jiang; Eric Shek-Fai Mak, both of Bellemeade; Steven Patrick O'Neill, Old Bridge; Bill Henry Reysen, Stewartsville, all of N.J.

[73] Assignee: The Whitaker Corporation, Wilmington, Del.

[21] Appl. No.: 808,299

[22] Filed: Feb. 28, 1997

Related U.S. Application Data

[60] Provisional application No. 60/012,463 Feb. 28, 1996.

[51] Int. Cl.⁶ .................................................. G02B 6/36
[52] U.S. Cl. .................................................. 385/92
[58] Field of Search ........................................ 385/88–94

[56] References Cited

U.S. PATENT DOCUMENTS

| | | | |
|---|---|---|---|
| 4,186,995 | 2/1980 | Schumacher | 350/96.2 |
| 4,222,629 | 9/1980 | Dassele et al. | 350/96.2 |
| 4,273,413 | 6/1981 | Bendiksen et al. | 350/96.2 |
| 4,302,070 | 11/1981 | Nakayama et al. | 350/96.19 |
| 4,307,934 | 12/1981 | Palmer | 350/96.2 |
| 4,386,821 | 6/1983 | Simon et al. | 385/92 |
| 4,718,744 | 1/1988 | Manning | 350/96.2 |
| 4,756,590 | 7/1988 | Forrest et al. | 350/96.15 |
| 4,842,360 | 6/1989 | Caro et al. | 350/96.18 |
| 4,897,711 | 1/1990 | Blonder et al. | 357/74 |
| 4,911,519 | 3/1990 | Burton et al. | 350/96.2 |
| 4,935,856 | 6/1990 | Dragoon | 362/307 |
| 4,979,791 | 12/1990 | Bowen et al. | 350/96.17 |
| 5,042,891 | 8/1991 | Mulholland et al. | 385/93 |
| 5,056,881 | 10/1991 | Bowen et al. | 359/19 |
| 5,073,003 | 12/1991 | Clark | 385/33 |
| 5,127,075 | 6/1992 | Althaus et al. | 385/94 |
| 5,347,605 | 9/1994 | Isaksson | 385/92 |
| 5,386,488 | 1/1995 | Oikawa | 385/92 |
| 5,500,911 | 3/1996 | Roff | 385/33 |
| 5,515,468 | 5/1996 | DeAndrea et al. | 385/88 |
| 5,594,237 | 1/1997 | Kulick et al. | 250/214.1 |
| 5,649,039 | 7/1997 | Benzoni et al. | 385/92 |
| 5,692,083 | 11/1997 | Bennett | 385/88 |

FOREIGN PATENT DOCUMENTS

| | | | |
|---|---|---|---|
| 0 375 251 | 6/1990 | European Pat. Off. | G02B 6/42 |
| 0 404 053 | 12/1990 | European Pat. Off. | G02B 6/42 |
| 35 43 558 | 12/1985 | Germany | G02B 6/42 |
| 0 542 011 A1 | 10/1992 | Germany | G02B 6/42 |
| 3031808 | 2/1991 | Japan | G02B 6/42 |
| 0 573 941 A1 | 6/1993 | Japan | G02B 6/42 |
| 2 162 336 | 1/1986 | United Kingdom | G02B 6/42 |
| 2178554A | 2/1987 | United Kingdom . | |
| 0 545 555 A1 | 11/1992 | United Kingdom | G02B 6/42 |

OTHER PUBLICATIONS

Patent Abstracts of Japan; 06300942; Apr. 15, 1993.

*Primary Examiner*—Hung N. Ngo
*Attorney, Agent, or Firm*—W. Francos

[57] ABSTRACT

A package for an optoelectronic device having an optical fiber in communication therewith. The parts of the package are generally of polymer material, preferably engineering thermoplastic, which is assembled to the fiber having the device mounted on a printed circuit board type material, FR4. The adhesion process of the individual parts of the package is done typically through a solvent bonding or an epoxy curing process that is done at room temperature, thereby eliminating the drawbacks of soldering at high temperature which has the attendant disadvantage of built in stress and thermal expansion resulting in misalignment of the individual parts. The related packaging technique greatly reduces the requirements of active alignment of the fiber to the device in the packaging of the device and fiber. Accordingly, the overall cost of the device is reduced by virtue of the reduced cost of the parts of the package as well as the process for fabrication of the package.

15 Claims, 2 Drawing Sheets

PACKAGING FOR OPTOELECTRONIC DEVICE

RELATED APPLICATIONS

This application claims priority from U.S. provisional patent application 60/012,463 filed on Feb. 28, 1996.

FIELD OF THE INVENTION

The present invention relates to a reduced cost package for optoelectronic devices.

BACKGROUND OF THE INVENTION

The present invention is related to U.S. Pat. No. 5,594,237, to Kulick et al., the disclosure of which is specifically incorporated herein by reference. Fiber to the Home (FTTH) is gaining a great deal of approval in the telecommunications industry, and accordingly there is a need to have a large quantity of optoelectronic devices to effect the communication to and from the home. However, as with most industries cost in the CATV industry is a great driver in the design of the components of the CATV market. While the devices used in the CATV industry may well have experience a reduction in cost, and an increase in performance, one of the major sources of cost in the industry is the required packaging of the devices. To this end packaging is often a substantial factor in the cost of the end product. To this end in the fiber to the home industry, where most packaging of photodetectors is in metal and particularly brass, the cost of the packaging is often proving to be prohibitive for large scale use, particularly to the individual home.

The standard practice for packaging of photodetectors and other optoelectronic devices has been to have a ceramic substrate having the device mounted thereon, and the ceramic substrate mounted in a metal, typically brass, housing. The various elements of the package are thereafter soldered and effect the package device thereby. The cost of the packaged device is driven generally by two factors, the cost of the individual parts and the cost of complex fabrication. The cost of the parts such as brass and a ceramic substrate, are generally much higher than alternatives, and the alignment as well as soldering techniques are generally complicated and thereby expensive. Accordingly what is needed is a packaged product that is lower in cost through the intrinsic cost of the individual parts, as well as lower in cost due to a much less complex packaging process.

SUMMARY OF THE INVENTION

The present invention relates to a package for an optoelectronic device having an optical fiber in communication therewith. The parts of the package are generally of polymer material, preferably engineering thermoplastic, which is assembled to the fiber having the device mounted on a printed circuit board type material, FR4. The adhesion process of the individual parts of the package is done typically through a solvent bonding or an epoxy curing process that is done at room temperature, thereby eliminating the drawbacks of soldering at high temperature which has the attendant disadvantage of built in stress and thermal expansion resulting in misalignment of the individual parts. Furthermore, the present invention enables the use of the above referenced CATV PIN detector, which in combination with the packaging technique of the present invention, reduces greatly the requirements of active alignment of the fiber to the device in the packaging of the device and fiber. Accordingly, the overall cost of the device is reduced by virtue of the reduced cost of the parts of the package as well as the process for fabrication of the package.

OBJECTS, FEATURES, AND ADVANTAGES

It is an object of the present invention to reduce the cost of packaged photodetectors without compromising performance.

It is a feature of the present invention to have polymer package elements for the packaged detector.

It is an advantage of the present invention to have a fiber readily aligned to the detector by use of the housing of the package.

DETAILED DESCRIPTION OF THE INVENTION

Figure 1:
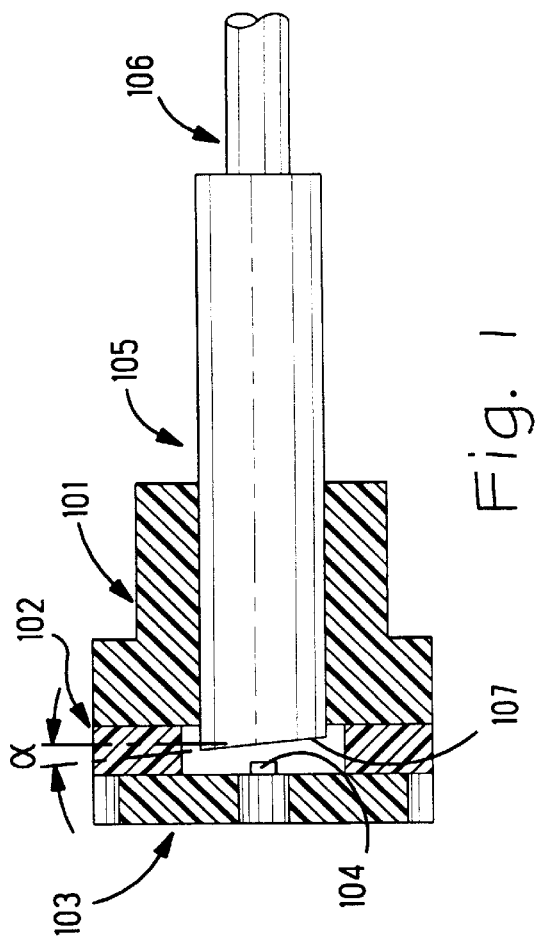
FIG. 1 is a cross sectional view of the package of the present invention showing the photodetector mounted on a substrate. The packaged elements include the packaged housing and spacer as well as the ferrule for the optical fiber and the fiber.
Figure 2:
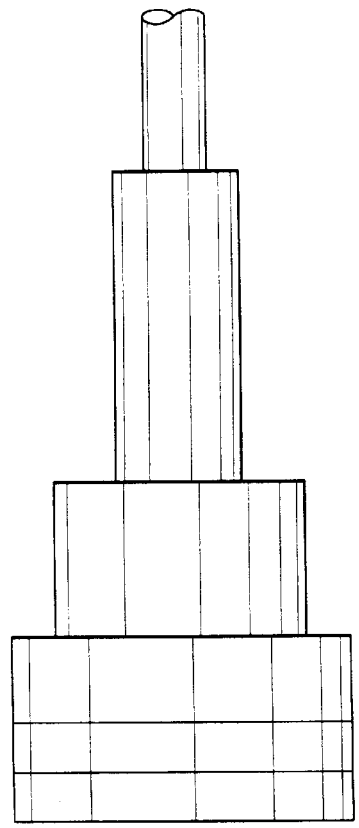
FIG. 2 is a side view of the package shown in cross section in FIG. 1.
Figure 5:
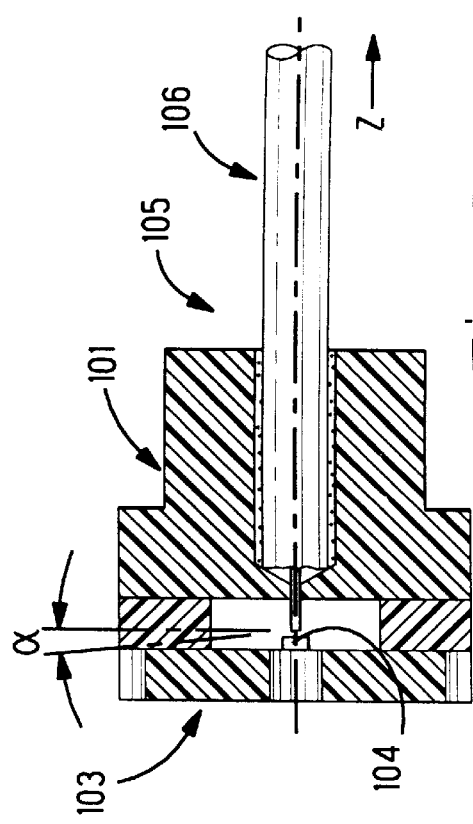
FIG. 5 is a cross-sectional view showing the embodiment of the present invention wherein the fiber is inserted directly into the housing without the use of a ferrule.
Figure 6:
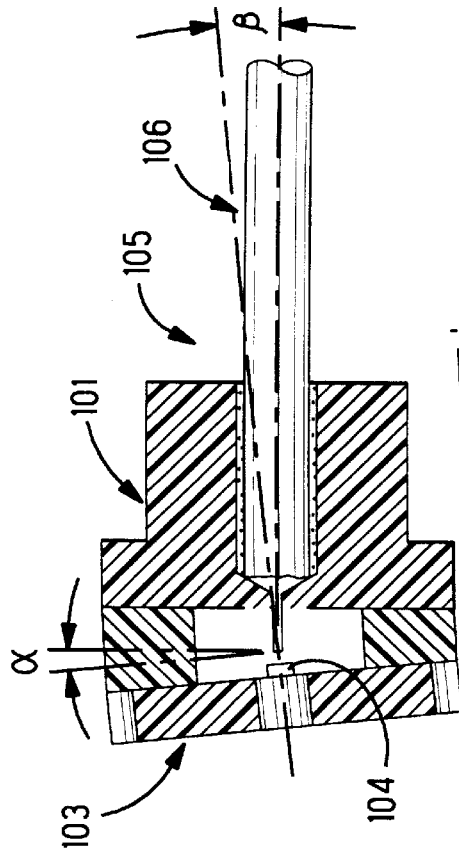
FIG. 6 is a cross-sectional view of the embodiment shown in FIG. 5 with the detector canted relative to the fiber.
Figure 7:
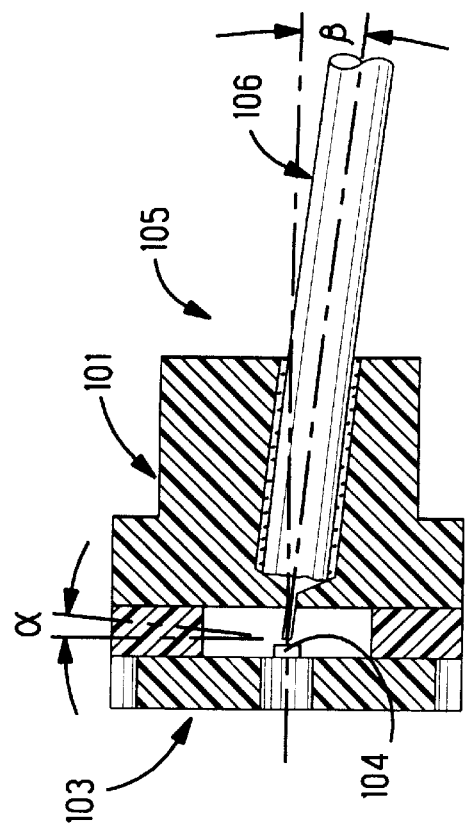
FIG. 7 is a cross-sectional view of the embodiment shown in FIG. 5 with a canted cylindrical portion in the housing.
Figure 8:
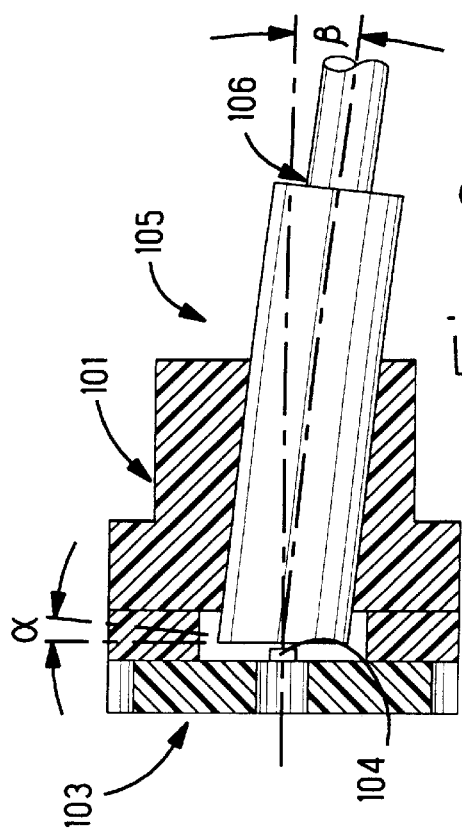
FIG. 8 is a cross-sectional view of the embodiment shown in FIG. 1 with a canted cylindrical portion in the housing.

Turning to FIG. 1 we see the package housing 101 as well as the spacer member 102 and substrate member 103 and photodetector 104 for the present invention. Furthermore member 105 is a ferrule for the optical fiber 106 of the present invention. The fiber to device coupling is effected through the housing member, the housing member 101 spacer 102 and ferrule 105 which are preferable thermoplastic; although polymer material in general will suffice. The substrate 103 having the PIN detector 104 is made of preferably FR4, general circuit board material. The assembly of the present invention is described presently. Note that it is possible to have a fiber mounted directly into the housing, foregoing the use of the ferrule. This embodiment is shown in FIG. 5 and 6, and in this case, the diameter of the cylindrical portion of the housing would be tapered down to on the order of outside diameter of the fiber cladding at the end closest to the detector. The fiber would then be epoxied in place by well known techniques.

Figure 3:
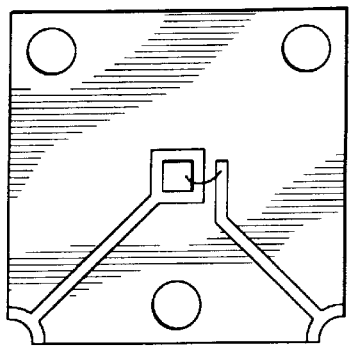
FIG. 3 is a top view of the substrate of the present invention having the PIN photodetector mounted thereon.

The optical fiber 106 of the present invention is mounted in a ferrule, or is attached directly by epoxy to the housing member 101, and is in optical communication with the photodetector 104 mounted on the substrate 103. The individual parts of the package are adhered via a curing process, typically a room temperature solvent bond which is described in further detail herein. The alignment of the various elements of the package is described presently. By virtue of the PIN detector as described in the parent application of the present invention, active alignment is generally not critical. The only active alignment is in determination of responsivity, a D.C. consideration. This is a determination of the coupling of the light from the fiber 106 to the PIN detector 104. To this end alignment is only required in the x and y direction as shown in FIG. 3, the plane of the detector, in the present invention, by virtue of the fact that alignment in the z direction normal to dielectric is fixed by the spacer and fixture that positions and stops the ferrule at the desired predetermined z position. The z position of the fiber endface has to be chosen to provide a trade off of light uniformity and intensity distribution on the detector photosensitive area and alignment tolerance. Thus, the z position of the fiber endface is driven by the application of the device. If used in single mode fiber applications where the spot size is desired to be relatively large, for example 40–60 microns in diameter, the height may be 150–200 microns from the device. In applications where a smaller spot is acceptable the distance from the end-face of the fiber to the device can be reduced. This reduced spot size allows for greater alignment tolerance in the x and y directions.

In the CATV PIN detector above referenced, the D.C. considerations, as described above determine the stopping point in the alignment process in the z direction. By virtue of the fact that the CATV PIN detector, as described in the parent application above-referenced, is substantially uniform in responsivity across the entire active area, x and y alignment is reduced greatly in criticality. Furthermore, the CATV PIN detector of the present application enables reduced photosensitive area due to uniformity of responsivity. Accordingly, the height of the fiber relative to the device can be tailored to maximize the performance of the device. In practice, this is on the order of 150–200 microns. Finally, it is of interest to note that a back-illuminated detector would allow the endface of the fiber to touch the device, thereby greatly reducing the precision required for z-height alignment.

As stated above, the materials used in the packaging of the present invention enable a reduction in the cost by their very nature as well as by the process of the assembly and fabrication of the package device. To this end, the spacer 102, housing member 101 and ferrule 105 are preferably made of polymer material, preferably engineering the thermoplastic, however other polymer materials within the purview of the artisan of ordinary skill will suffice. The ferrule member could be a molded holder/ferrule assembly with a fiber fixed therein or could be a direct epoxy of the fiber in a pig-tailing fashion, known well in the art. The curing process in the prior packaging techniques is typically a solder process or an epoxy/welding process that requires a high curing temperature, usually too high for standard fiber. Furthermore, this process causes thermal expansion due to the high temperature of the soldering and welding processes when a metal housing and a ceramic substrate are used. Accordingly, the alignment of the fiber to the PIN detector once established is often disturbed by thermal expansion of the various elements through the heating during the curing adhesion process and during subsequent cooling of the various elements. Furthermore, high temperature soldering processes typically used in assemblies with built-in stresses, which over time or through subsequent temperature cycling can be relieved resulting in misalignment. Accordingly, the yields are generally much lower than is achievable in the present invention and the resulting overall cost per part is further reduced by virtue of room temperature solvent bonding of the various parts. To this end, the parts are aligned in place. Solvent is then applied at the intersection of the spacer and housing thus fixing the assemblies in place. Prior to the alignment process, the substrate is bonded to the spacer by epoxy. The materials used herein is polymer such as polyethersulfone and polyetherimide and the solvent used in the bonding process of the various elements of the package is preferably methylene chloride although other solvent families are possible.

Figure 4:
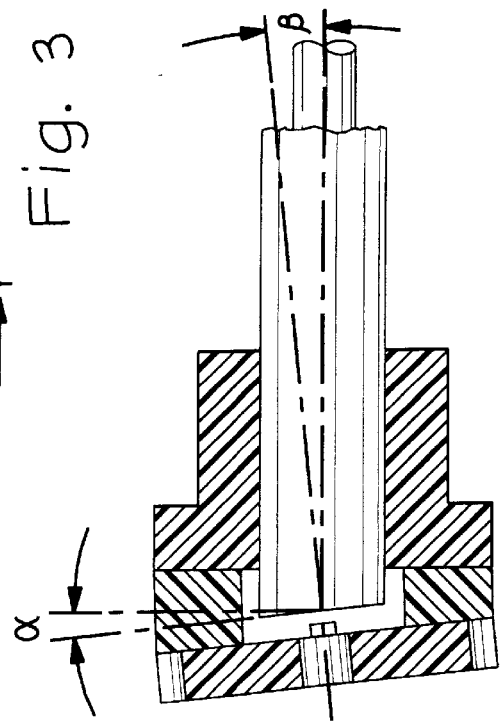
FIG. 4 is a cross-sectional view of the present invention shown in FIG. 1 with the detector canted relative to fiber.

For the purposes of increasing performance, the end face of the fiber/ferrule assembly shown at 107 is angle polished or angle cleared by standard technique. This is to reduce back reflections when light traveling in the fiber is incident upon the fiber end face and is reflected back into the fiber. This is a standard practice in the art, and the angle $\alpha$ is as shown in FIG. 4. The angle relative to the normal to the optic axis of the fiber is preferably between 4° and 15°. However, this angle can be varied as is discussed below.

Furthermore, in a further embodiment, the PIN detector is canted at an angle $\beta$ relative to the optic axis of the fiber or the fiber is canted at an angle $\beta$ relative to the normal of the PIN detector. This angle is also preferably in the range of 4°–15°. This cant is effected to reduce back reflection from the device back into the fiber. To this end, while an anti-reflective (AR) coating can be applied to the device to assist in reducing back reflection to the fiber, AR coatings usually are not perfectly anti-reflecting and increase the cost of the device. Accordingly, it is required to cant the device and fiber relative to one another, so reflected light from the device is not impingent within the acceptance angle of the fiber. The present invention effects the cant by having one side of the spacer of a lower height than the other side. This effects the cant. Of course, the fiber can be canted by various means including canting the fiber in a ferrule or canting the cylindrical portion of the housing 101.

As stated, the angle $\alpha$ and $\beta$ required to obtain a given back reflection into the fiber are related. To this end, the smaller $\alpha$ is, the smaller the refraction angle of the light exiting the fiber. This refracted light is incident on the device, and this light is partially reflected back to the fiber from the device. Accordingly, as angle $\alpha$ is decreased the angle $\beta$ must be increased in order to assure no light is reflected back into the fiber. Should the angle a be made larger, the light is refracted at a larger angle. This refracted light is incident on the device and reflected therefrom toward the fiber. In this case the angle $\beta$ can be made smaller. It is thus the case that the chosen angle for $\alpha$ affects the required angle $\beta$ to achieve minimal back reflection and vice-versa. The exemplary angles for $\alpha$ and $\beta$ are 8° and 6° respectively. It is of interest to note that a less preferred embodiment would be effected by a large angle polish, greater than or equal to about 18°. In this embodiment, the light emerges from the fiber endface at substantially elliptical cross-section due to refractive effects. It is then impingent on the detector at a sufficient high angle that light which is reflected from the detector is thus not incident upon the fiber core. Accordingly, no cant is required ($\beta$=0). A detector optimized for use with a beam of elliptical cross section is disclosed in U.S. Provisional application 60/003,355 to Wilson.

The invention having been described in detail, it is clear that there are variations in keeping with the theme in spirit of the invention to the artist of ordinary skill. To this end, there are other materials as well as other components that could be utilized to reduce the cost of the device through a reduction in the cost of the particular materials as well as the fabrication process, without sacrificing if not improving the overall performance of the device and its interaction with the fiber. Such variations are considered within the purview of the present invention.

We claim:

1. A package for an optoelectronic detector comprising:
   a substrate having an optoelectronic detector mounted thereon;
   a polymer housing having a first end and a second end and a substantially cylindrical portion between said first end and said second end;
   an optical fiber mounted in said cylindrical portion of said optical fiber having a first end and a second end where said first end is in optical communication with said optoelectronic detector; and
   a spacer mounted between said first end of said housing and said substrate for effecting alignment of said fiber to said detector in at least one direction, wherein said substrate, said spacer, and said housing are adhesively fixed.

2. A package for an optoelectronic photodetector as recited in claim 1 wherein said optical fiber is housed in a ferrule, and said ferrule is mounted in said substantially cylindrical portion of said housing.

3. A package for an optoelectronic photodetector as recited in claim 2 wherein said optical fiber has as optic axis substantially parallel to the geometric axis of said substantially cylindrical portion of said housing, and said ferrule has a first end in communication with said photodetector, said first end of said ferrule and said optical fiber being at an angle other than orthogonal to said optical axis of said fiber.

4. A package for an optoelectronic photodetector as recited in claim 1 wherein said adhesive fixing of said substrate, said spacer, and said housing is by solvent bonding.

5. A package for an optoelectronic photodetector as recited in claim 1 wherein said adhesive fixing of said substrate, said spacer, and said housing is by other than soldering.

6. A package for an optoelectronic photodetector as recited in claim 1 wherein said optical fiber has an optic axis substantially parallel to the geometric axis of said substantially cylindrical portion.

7. A package for an optoelectronic photodetector as recited in claim 6 wherein said first end of said optical fiber has an end face at an angle other than orthogonal to the optic axis of said fiber.

8. A package for an optoelectronic photodetector as recited in claim 7 wherein the geometric axis of said optical fiber is at an angle other than an orthogonal to the optoelectronic photodetector.

9. A package as recited in claim 1, wherein said spacer comprises a polymer material.

10. A package for an optoelectronic photodetector, comprising:
    a substrate having a lower surface and an upper surface, and a photodetector mounted on said upper surface;
    a polymer spacer member mounted to said upper surface of said substrate;
    a polymer housing member having a first end and a second end, said first end connected to said polymer spacer member, and said housing having a substantially cylindrical portion between said first end and said second end, wherein said substrate, said spacer member, and said housing member are adhesively fixed; and
    an optical fiber mounted in a ferrule, said optical fiber and said ferrule mounted in said substantially cylindrical portion of said housing, whereby said optical fiber is in optical communication with said photodetector.

11. A package for an optoelectronic photodetector as recited in claim 10 wherein said optical fiber has an optic axis substantially coincident with the axis of said substantially cylindrical portion of said housing member and said fiber has an endface in communication with said photodetector, said endface forming an angle other than an orthogonal angle with said optic axis.

12. A package for an optoelectronic photodetector as recited in claim 10 wherein said housing member, said spacer and said substrate are solvent bonded.

13. A package for an optoelectronic photodetector comprising:
    a substrate on which the detector is mounted;
    a housing connected to the substrate having a spacer there between, wherein said substrate, said spacer and said housing are adhesively fixed; and
    an optical fiber disposed in said housing, the optical fiber in communication with the detector, characterized in that:
    the housing is made of a polymer material.

14. A package as recited in claim 1 or claim 13, wherein said polymer is a thermoplastic material.

15. A package as recited in claim 13, wherein said spacer comprises a polymer material.

* * * * *